(12) United States Patent
Fan

(10) Patent No.: US 7,857,649 B2
(45) Date of Patent: Dec. 28, 2010

(54) ELECTRICAL CONNECTOR

(75) Inventor: Chia-Wei Fan, Tu-Cheng (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 12/481,601

(22) Filed: Jun. 10, 2009

(65) Prior Publication Data

US 2009/0305546 A1 Dec. 10, 2009

(30) Foreign Application Priority Data

Jun. 10, 2008 (CN) .................................. 09 7 2102

(51) Int. Cl.
*H01R 13/625* (2006.01)
(52) U.S. Cl. ..................................................... 439/342
(58) Field of Classification Search .......... 439/342–345
See application file for complete search history.

(56) References Cited

U.S. PATENT DOCUMENTS 6,485,320 B1   11/2002  Ma
7,182,620 B1 * 2/2007  Ju ............................... 439/331
7,476,115 B2 * 1/2009  Zhang et al. ................. 439/331
2004/0018769 A1 * 1/2004  Ma ............................. 439/342

* cited by examiner

*Primary Examiner*—Renee Luebke
*Assistant Examiner*—Larisa Tsukerman
(74) *Attorney, Agent, or Firm*—Andrew C. Cheng; Wei Te Chung; Ming Chieh Chang

(57) ABSTRACT

An electrical connector comprises an insulating housing, a pair of levers and a bracket. The insulating housing includes a receiving slot for receiving a chip. The bracket encircles the insulating housing, which includes several side walls and a empty portion surrounded by the side walls, on the side wall there defines a fasten portion. The lever is set beside two opposite side of the chip, which comprises a pintle portion, an operating portion and a main portion connecting the pintle portion and the operating portion, the pintle portion is received in the fasten portion of the bracket. Protruding towards inner side from the main portion there forms a press portion for retain the chip. The structure of the invention is simply, which economizes the cost of manufacture and is efficient for operating.

14 Claims, 3 Drawing Sheets

ELECTRICAL CONNECTOR

BACKGROUND OF THE INVENTION

1. Field of the Invention

The present invention relates to the art of electrical connector, and more particularly to an electrical connector utilizing a lever to retain a CPU chip.

2. Description of the Related Art

As is well known to those skilled in computer art, when electrically connecting a CPU chip to an electrical connector, there must be some device to provide a positive force on the chip, not only to retain the chip from dropping off the connector but also to promise the chip electrically connecting with the contact of the connector tightly and stably to ensure a good electrical performance therebetween. The American patent with an issue number U.S. Pat. No. 6,485,320 discloses an electrical connector, which includes a base for receiving a CPU chip, a moveable cover and lever mounted on the base, via the lever engaging with the cover to retain the chip, thereby to realize an electrical connecting between the contact of the connector and the chip.

However, said connector needs both a lever and a cover to engage with each other to retain the chip, it has so many elements that will increase the cost of manufacture and is complex for operating.

Hence, it's necessary to ameliorate the exist connector to overcome said drawbacks.

SUMMARY OF THE INVENTION

An object of the invention is to provide a connector, which is capable of simplifying the structure of the connector and saving the cost.

According to said object, an electrical connector according with the present invention comprises an insulating housing, a lever and a bracket. The insulating housing includes a receiving slot for receiving a chip. The bracket encircles the insulating housing, which comprises a plurality of side walls and a space surrounded by the side walls. On one of the side walls, there defines a fasten portion. The lever is set beside two opposite sides of the chip, the lever includes a pintle portion, an operating portion and a main portion connecting the pintle portion and the operating portion. The pintle portion is received in the fasten portion of the bracket. The main portion is inflexed to form a press portion for abutting the chip.

Comparing with the traditional connector, the connector according with the present invention fastens the chip via the inflexed press portion of a pair of levers, which simplifies the structure of the connector and economizes the cost of manufacture and is efficient for operating.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
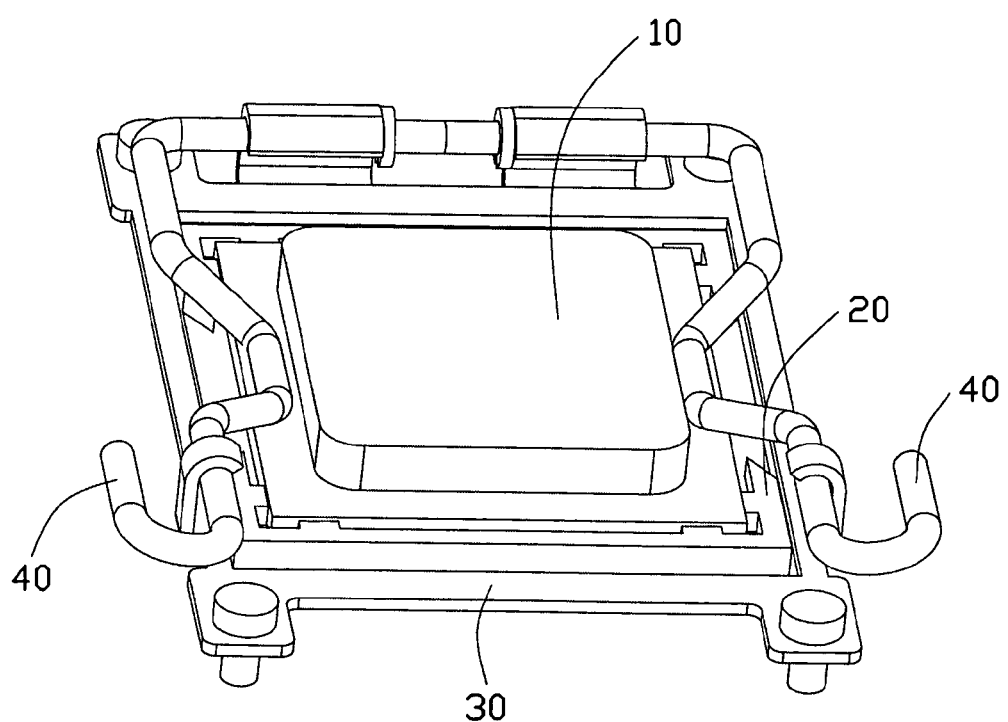
FIG. 1 is a perspective view of an electrical connector according to an embodiment of the present invention.
Figure 2:
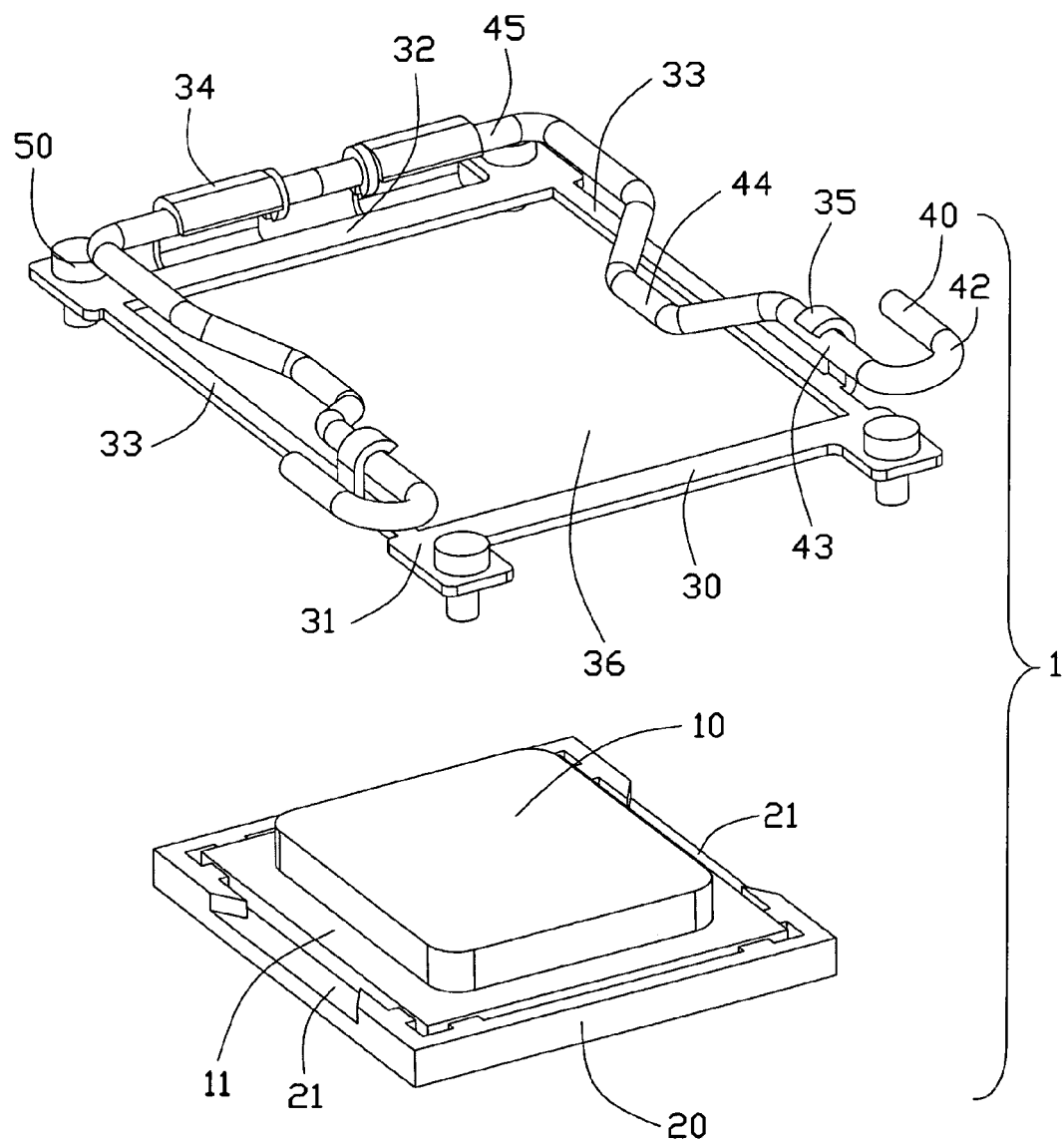
FIG. 2 is an exploded, perspective view of the electrical connector of FIG. 1.
Figure 3:
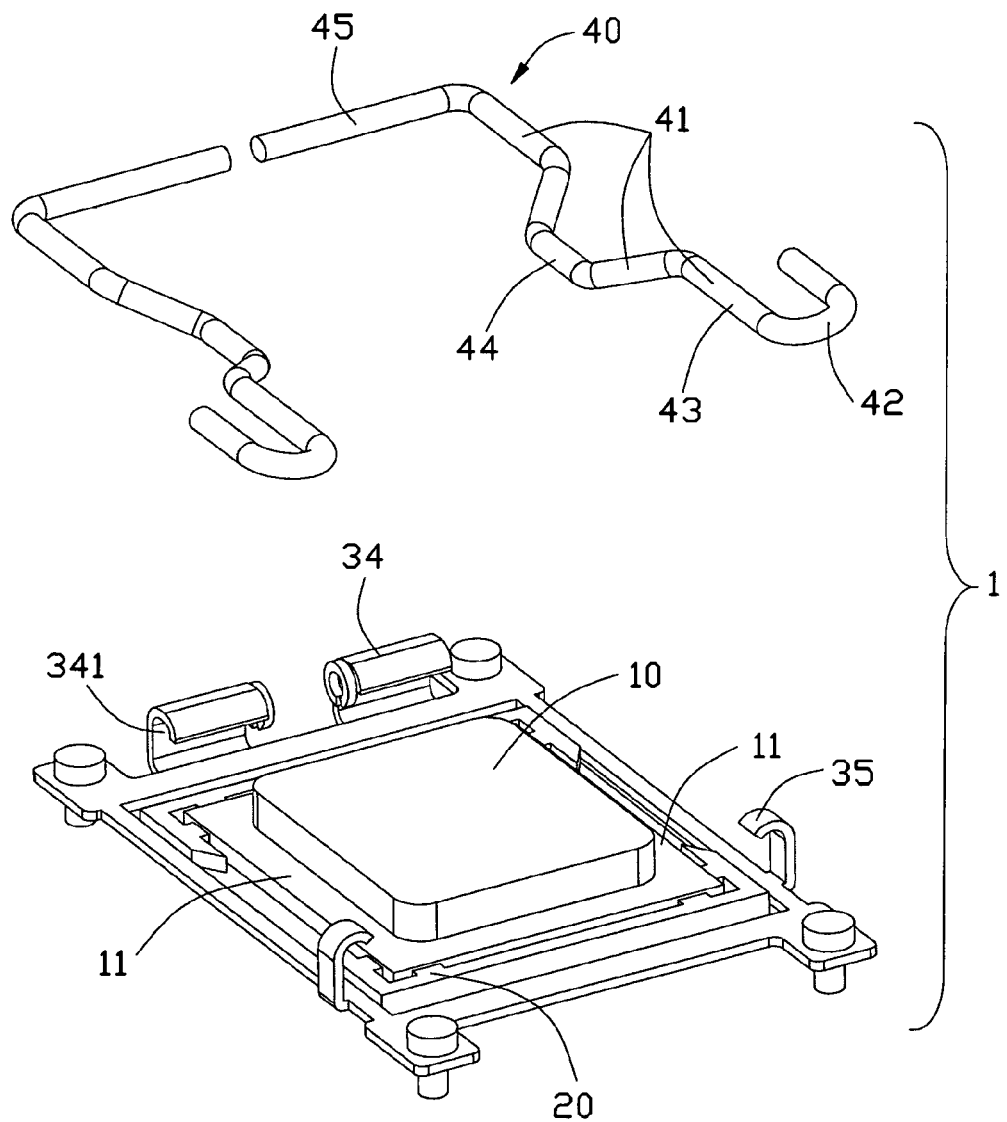
FIG. 3 is another exploded, perspective view of the electrical connector contact of FIG. 1.

Referring to FIGS. 1 to 3, the FIGS. Show one preferred embodiment of a connector 1 according with the present invention. The connector 1 includes an insulating housing 20 for receiving a CPU chip 10 and a bracket 30 encircling the insulating housing 20. On the bracket 30, there mounted a pair of levers 40. When the lever 40 is on an opening condition, the chip 10 can be picked up from the connector 1, and when the lever 40 is on a close condition, the chip 10 is fastened in the insulating housing 20.

Please referring to FIG. 1 to FIG. 3, the insulating housing 20 is approximate a rectangular shape with a receiving slot (not labeled) defined thereon. In the bottom of the receiving slot, there defines a plurality of terminals (not shown) for connecting with the chip 10. The chip 10 is generally constructed with the central protruding from the base, thereby the left construction of the base forms a plurality of contact surfaces 11.

Said bracket 30 is mounted surrounding the insulating housing 20, the bracket 30 is a frame shape with the central being empty. At the central of the bracket 30, there defines a empty portion 36, the chip 10 is mounted in the receiving slot via the empty portion 36. The bracket 30 includes four corner 31, on each corner 31, there fastened a retain member 50 for fastening the bracket 30 with a circuit board (not shown). On external side of the empty portion 36, there defines four side walls 32, 33 surrounding the empty portion 36, said corners 31 are formed at the position that every two side walls 32, 33 joint with each other. At the front ends of the two longitudinal side walls 33 extending outwards and bending upwards there forms a pair of hooks 35. extending rearwards from the back transverse side wall 32, there forms a pair of fastening portion 34 with a hole slot 341 for receiving one end of the lever 40 formed therein.

The lever 40 is defined with a pair levers, each lever 40 includes a main portion 41 and a pintle portion 45. The pintle portion 45 is constructed to be inflexed from the end of the main portion 41 and almost perpendicular with the main portion 41. The pintle portion 45 of the lever 40 is received in the hole slot 341 of the fastening portion 34. A pair of fasten circle (not labeled) sheath the pintle portion 45 dividedly to limit the position of the lever 40 on a left right direction. The main portion 41 is set above the longitudinal side wall 33, the middle section of the main portion 41 bends inwards to form a protruding press portion 44. The press portion 44 abuts against the contact surface 11, when the chip 10 is inserted into the connector 1, the press portion 44 of the lever 40 presses the chip 10 to offer a necessary force to fasten the chip 10 and make the chip 10 electrically connecting with the contacts in the insulating housing 20 tightly. At the front end of the lever 40, there forms a flexural operating portion 42. The main portion 41 further includes a lock portion 43 connecting the operating portion 42 with the press portion 44. In other embodiment, the two lever 40 also can be formed as a integer by jointing the two pintle portion 45 together, which can be locked in the fasten portion 34 by being inserted into the fasten portion 34 from the under wards of the fasten portion 34.

When assembling, firstly mount the insulating housing 20 on a circuit board, and fasten the bracket 30 on the circuit board where the insulating housing 20 mounted, the insulating housing 20 can be exposed from the empty portion 36 of the bracket 30, then, assemble the levers 40 by inserting the pintle portion 45 from below towards up into the fasten portion 34 of the bracket 30, following, put the chip 10 into the receiving slot through the empty portion 36 to make the chip 10 electrically connecting with the contacts in the insulating housing 20, at this time, the levers 40 are on opening condition. Finally, press the operating portion 42 of the lever 40 downwards, the press portion 44 will abut the contact surface 11 of the chip 10, continue press the operating portion 42, till the lock portion 43 engages with the hook 35 of the bracket 30, at this time, the levers 40 are on close condition, the chip 10 is stably fastened by the press portion 44. When add a force that downwards and deflected towards inner side on the operating portion 42, the lever 40 will be divorced from the hook 35 and return to an opening status.

Comparing with the conventional connector, the connector 1 according with the present invention fastens the chip via a pair of levers 40, which simplifies the structure of the connector, economizes the cost of manufacture and is efficient for operating.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector comprising:
    an insulating housing comprising a receiving slot for receiving a chip;
    a bracket encircling the insulating housing and comprising a plurality of side walls and an empty portion surrounded by the side walls, the side wall defining a fastening portion;
    a lever comprising a pintle portion, an operating portion and a main portion connecting the pintle portion with the operating portion, the pintle portion received in said fastening portion of the bracket;
    wherein, the main portion and the operating portion of the lever are set beside two opposite side of the chip, the main portion protrudes inwardly to form a press portion for retaining the chip; wherein said press portion is formed by bending inwards and downwards from the middle of the main portion, and wherein said press portion of the lever abuts against a contact surface of the chip.

2. The electrical connector of claim 1, wherein said lever comprises two levers set at the external side of the chip.

3. The electrical connector of claim 2, wherein the levers are set symmetrically.

4. The electrical connector of claim 1, wherein said side walls comprise a pair of longitudinal side walls and a pair of transverse side walls, said pintle portion of the lever is mounted on the transverse side wall, a hook is formed on each longitudinal side wall, the main portion of the lever defines a lock portion, and the lock portion engages within the hook to limit the lever on up and down direction.

5. The electrical connector of claim 1, wherein said operating portion is formed by bending the end of the lock portion of the lever.

6. The electrical connector of claim 1, wherein the pintle portion is sheathed by a fastening circle to limit the position of the lever on a sideward direction.

7. An electrical connector assembly for mounting to a printed circuit board, comprising:
    an insulative housing for mounting to said printed circuit board, having a plurality of contacts therein and defining a receiving cavity in an upper face;
    an electronic package disposed in the receiving cavity;
    a bracket located around the housing having fastening devices for mounting to said printed circuit board;
    a pair of levers discrete from each other and respectively pivotally mounted to the bracket to press opposite sides of the electronic package; wherein the housing defines a pair of cutouts in two sides for facilitating extension of the levers during locking.

8. The electrical connector assembly as claimed in claim 7, wherein both said levers are pivotally mounted to a same side of the bracket.

9. The electrical connector assembly as claimed in claim 8, wherein said pair of levers are arranged in a mirror-image manner.

10. The electrical connector assembly as claimed in claim 7, wherein said levers, independent from each other, are respectively locked to opposite sides of the bracket.

11. An electrical connector assembly for mounting to a printed circuit board, comprising:
    an insulative housing for mounting to said printed circuit board, having a plurality of contacts therein and defining a receiving cavity in an upper face for receiving an electronic package therein;
    a bracket located around the housing having fastening devices for mounting to said printed circuit board;
    a pair of levers discrete from each other and respectively pivotally mounted to the bracket for respectively pressing opposite sides of the electronic package; wherein the housing defines a pair of cutouts in two sides for facilitating extension of the levers during locking.

12. The electrical connector assembly as claimed in claim 11, wherein both said levers are pivotally mounted to a same side of the bracket.

13. The electrical connector assembly as claimed in claim 12, wherein said pair of levers are arranged in a mirror-image manner.

14. The electrical connector assembly as claimed in claim 11, wherein said levers, independent from each other, are respectively locked to opposite sides of the bracket.

* * * * *